Aug. 27, 1968 J. J. ANDREA 3,399,311

FREQUENCY DIVIDER EMPLOYING INDUCTIVE SWITCHING

Filed Aug. 4, 1966

INVENTOR.
JOHN J. ANDREA

BY Moody and Phillion

ATTORNEYS 3,399,311

FREQUENCY DIVIDER EMPLOYING INDUCTIVE SWITCHING

John J. Andrea, Marion, Iowa, assignor to Collins Radio Company, Cedar Rapids, Iowa, a corporation of Iowa Filed Aug. 4, 1966, Ser. No. 572,645
11 Claims. (Cl. 307—225)

ABSTRACT OF THE DISCLOSURE

A frequency divider employing a multivibrator type circuit having a pair of transistors with the base electrodes connected together by a tapped inductor. An A-C input signal is applied to the tap to control the switching rate of the multivibrator. The tapped inductor functions as a very stable, electrical flywheel to enable accurate frequency division over quite large frequency and temperature ranges. Output signals can be taken from the collector or emitter of either transistor.

This invention relates generally to frequency dividers and, more particularly, to a frequency divider employing a nonresonant inductive switching means which functions to enable the frequency divider to operate over a wide range of frequencies.

In the prior art there are many multivibrator circuits which employ flip-flop type circuits. Some of these multivibrator circuits employ a parallel resonant circuit to control the frequency of operation. For example, in one prior are circuit, the parallel tuned circuit is transformer coupled, by the end terminals of a center tapped secondary winding, to the bases of two transistors which form the heart of the flip-flop circuit. The center tap itself is connected to the common junction of the emitters of the two transistors. Properly timed bursts of energy are supplied through feedback means from the output of the multivibrator to the parallel tuned circuit to maintain operation of the tuned circuit.

One of the limitations encountered with the use of a parallel tuned circuit in a multivibrator is the resultant limited range of frequencies. It is apparent that the resonant frequency of the tuned circuit must be changed in order to change the operating frequency of the multivibrator. The range of such tuning is limited.

A further disadvantage of many prior art multivibrator systems lies in the use of cross-coupling circuits which contain capacitors. Such capacitors introduce delays in the circuits and also result in limitation of the upper frequency of operation.

An object of the present invention is to provide a frequency divider which will operate at frequencies up to the order of 250 megacycles and higher.

A second purpose of the invention is to provide a frequency divider which will operate over a band of frequencies of the order of ten to one.

A third object is to provide a frequency divider which will operate reliably over a wide range of temperatures.

A fourth aim of the invention is to provide a frequency divider which will operate over a wide range of frequencies of the order of 25 to 250 megacycles or better and over a range of temperatures of approximately —50°–100° C.

A fifth object of the invention is to provide a frequency divider employing the controlled stored energy of an inductor to actuate the divider.

A sixth purpose of the invention is the improvement of frequency dividers generally.

In accordance with the invention there is provided a pair of electron valves, such as transistors, with the emitters thereof connected through a common impedance to a first terminal of a power supply, and with the collectors connected to the other terminal of the power supply through individual collector load impedances. The base electrodes of the transistors are connected together through an inductor which has a tap thereon. Resistive cross coupling circuits connect the collector of each transistor to the base electrode of the other transistor. An A-C input signal is supplied to the tap of the inductor through a coupling capacitor. Such input signal will function to control the switching of the two transistors in a manner described generally as follows:

During the operation of the circuit, the two transistors become alternately conductive, with the other transistor being nonconductive. When a given first transistor is conductive, a current will flow through the tapped inductor in a given first direction and will also flow, in completing its path, through the conductive transistor. Assume that such condition will exist during the positive half cycle of the input pulse. When the input pulse goes negative, the conductive first transistor is cut off, thereby opening the current path for the current flowing through the inductor, and the polarity of the voltage across the inductor reverses. At that point in time, the inductor changes from a load to a source. When the polarity of the input signal then next crosses zero and goes positive, the other, second transistor becomes conductive. During the conductive time interval of said second transistor, the current through the inductor reverses and it again becomes the load rather than a source, in preparation for the next cycle of operation. The frequency of operation of the circuit is determined primarily by the frequency of the input signal.

In accordance with the feature of the invention, the tapped inductor is employed to provide the necessary kick of energy to cause the transistors to switch states, i.e., for the conductive transistor to become nonconductive and for the nonconductive transistor to become conductive.

The above-mentioned and other objects and features of the invention will become more fully understood from the following detailed description thereof when read in conjunction with the drawings in which.

Figure 1:
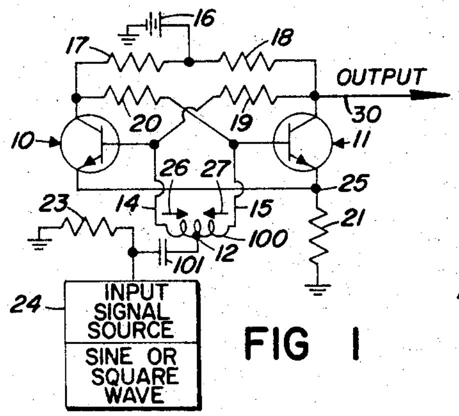
FIG. 1 is a schematic diagram of the invention.

Referring now to FIG. 1, transistors 10 and 11 function as switches in the circuit with one transistor being conductive while the other is nonconductive. The emitters of transistors 10 and 11 are connected to ground potential through common resistor 21 and the collectors thereof are connected to the positive terminal of battery source 16 through collector load resistors 17 and 18, respectively. Cross coupling circuits, comprising resistors 20 and 19, connect the collectors of transistors 10 and 11, respectively, to the bases of transistors 11 and 10.

An inductor 100 with a tap thereon connects the bases of the transistors 10 and 11 together. An input signal shown in FIG. 2A is supplied from the input signal source 24 through coupling capacitor 101 to tap 12 on inductor 100. Resistor 23 functions to provide a discharge path for the left-hand plate of capacitor 101, thus preventing accumulation of charge on said capacitor.

Figure 2:
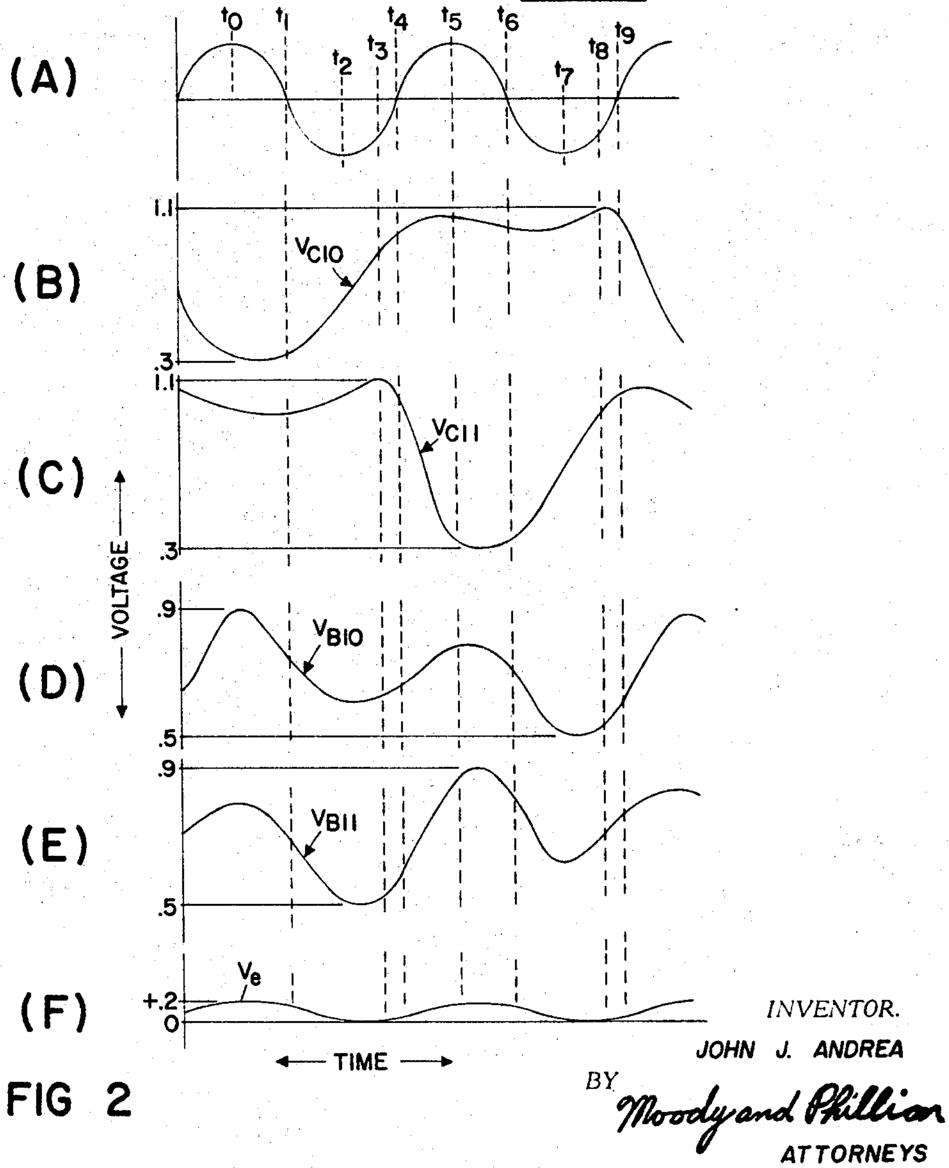
FIG. 2 is a set of waveforms A through F identifying the voltages at various points of the circuit of FIG. 1 during the operation of said circuit.

In the waveforms of FIG. 2, waveform B represents the collector potential of transistor 10 and waveform C represents the collector potential of transistor 11, over a complete cycle of operation. The waveforms of FIGS. 2B and 2C were taken from an oscilloscope tracing made during a test of the circuit of FIG. 1. It will be observed that beginning at times $t_3$ and $t_8$ the transistors 11 and 10, respectively, are switched on. Such switching on is evidenced by the decrease in the waveforms of FIGS. 2C and 2B at times $t_3$ and $t_8$.

The waveforms of FIGS. 2D and 2E show the voltage at the bases of transistors 11 and 10, respectively, with the same time base as the waveforms of FIGS. 2A, 2B, and 2C. The waveform of FIG. 2F represents the emitter potential at the point 25, and varies between ground, during a short time interval when both transistors are turned off, and plus 0.2 volt and when one or the other of the transistors are conductive at its maximum conductivity.

The invention is best understood by describing the operation thereof. Assume that the circuit is already operating and that the input signal from source 24 at the tap 12 is at its maximum positive value, as indicated at time $t_0$ in FIG. 2A. Assume further that transistor 10 at time $t_0$ is conductive and that transistor 11 is nonconductive. Under such conditions the collector of transistor 11 will be at a higher potential than that of the collector of transistor 10 since there is a current flowing from battery 16 through resistor 17, transistor 10, and emitter resistor 21 to ground.

Another current, however, is established from battery 16 through resistor 18, resistor 19, inductor 100, resistor 20, conductive transistor 10, and resistor 21 to ground. The reason for the second current path is simply that the potential of the collector of transistor 11 is higher than that of the collector of transistor 10. The current flowing through inductor 100 will be in the direction of arrow 26, and inductor 100 will be acting as a load to the current therethrough.

As the input signal applied to tap 12 goes to zero at time $t_1$, and then begins to go negative, transistor 10 will remain conductive since there is a certain RC time delay within transistor 10 itself due to inherent capacitances therein. However, when the input voltage of waveform 2A is near its most negative point at time $t_2$, transistor 10 will be well on the way to becoming completely turned off. Observations made during the testing of the circuit indicate that transistor 10 will become substantially turned off at about time $t_3$. At time $t_3$, the current path for the current through inductor 100 opens and such current tends to go rapidly towards zero. Because of this rapidly decreasing current in inductor 100, the voltage across the inductor reverses polarity, and the stored energy in the inductor causes it to become an energy source rather than a load.

The right-hand terminal of inductor 100 is now positive. Said positive voltage is supplied to the base of transistor 11 causing transistor 11 to become conductive beginning at a time just immediately after time $t_3$ in FIG. 2.

As transistor 11 becomes more conductive and the potential of the collector voltage thereof falls, as shown in the curve FIG. 2C, beginning at time $t_3$ and extending through to time $t_5$, it is apparent from waveforms 2B and 2C that the collector potential of transistor 10 is much greater than the collector potential of transistor 11. Consequently, the current flow through the inductor 100 will have begun to flow in the direction of arrow 27 at some point between time $t_3$ and $t_5$. When such current begins to flow through inductor 100 in such a direction the inductor will be acting as a load rather than a source.

The transistor 11 will remain conductive during the positive half cycle of the waveform of FIG. 2A, between times $t_4$ and $t_6$, and on into the next negative half cycle. However, as the waveform of FIG. 2A begins to go negative at time $t_6$ transistor 11 will begin to turn off and will be completely turned off at time $t_8$ which corresponds to the time $t_3$ discussed above in connection with transistor 10 being turned off. At time $t_8$ when transistor 11 becomes completely turned off, the current path through inductor 100 will again be open circuited and the voltage across the inductor 100 will again reverse so that a positive potential is supplied to the base of transistor 10 from the left-hand terminal thereof. Thus conduction of transistor 10 is begun at time $t_8$, as shown in the curve of FIG. 2B.

In the curves of FIGS. 2D and 2E, there are shown, respectively, the waveforms of the voltages of the bases of transistors 10 and 11. At time $t_3$ when transistor 10 was turned off and the polarity in the inductor 100 reversed so that the right-hand terminal 15 thereof was positive, the waveform of FIG. 2E shows that the base voltage $V_{B11}$ of transistor 11 began to rise rather sharply. The rise of the base voltage $V_{B11}$ during time interval $t_3$–$t_5$ corresponds closely to the drop in the collector voltage $V_{C11}$ of FIG. 2C.

It should be noted that the base voltage $V_{10}$ of transistor 10, shown in FIG. 2D, also begins to rise at time $t_3$, but not nearly as much as that of the base of transistor 11. The rise of the voltage $V_{B10}$ at time $t_3$ is due to the fact that the potential of the point 12 is increasing, as shown in the curve of FIG. 2A.

Again at time $t_8$, when transistor 11 becomes nonconductive, the potential of the base of transistor 10 will increase sharply due to the reversal of potential in inductor 100.

In FIG. 2F there is shown the voltage appearing at the point 25, which is the emitter voltage of the system. It will be noted that such emitter voltage has the same frequency and phase as the input signal supplied to tap 12 of inductor 100.

Figure 3:
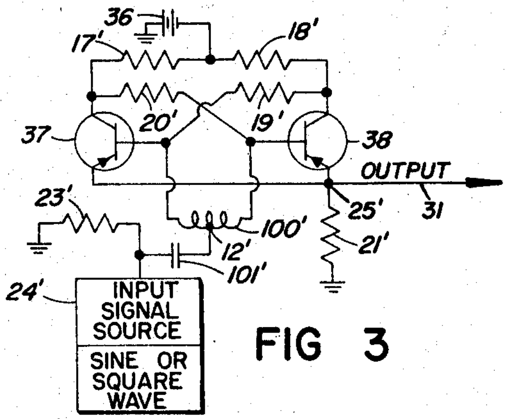
FIG. 3 shows a schematic diagram of another form of the invention.

The output of the circuit of FIG. 1 can be taken either from the collector electrode as indicated by lead 30 in FIG. 1 or, alternatively, across the emitter resistor 21', as shown by output lead 31 of FIG. 3. Further, the output can be taken from either transistor of FIGS. 1 or 3. In order to obtain the fundamental sine wave contained in the waveforms of FIGS. 2B and 2C, a conventional filter means can be employed. It is apparent from the waveforms of FIGS. 2B and 2C that the fundamental frequency therein is one-half that of the input signal of FIG. 2A.

Referring now to FIG. 3, there is shown another form of the invention employing PNP type transistors 37 and 38 rather than the NPN type transistors 10 and 11 of FIG. 1. With the use of PNP type transistors of FIG. 3 the battery source 36 must be negative rather than positive in polarity. The remaining components of the circuit of FIG. 3 are similar to those of FIG. 1 and are identified by the same reference character, although primed The operation of the circuit of FIG. 3 is much the same as that of FIG. 1 except that the polarities are reversed. For example, the switching occurs during the positive half cycle of the input waveform from source 24' rather than the negative half cycle. Generally speaking, the operating waveforms relating to the circuit of FIG. 3 correspond to inversions of the waveforms shown in FIGS. 2B and 2F.

In one preferred embodiment of the invention the components of the circuit of FIG. 1 can have the following values:

$R_{17}$=1K
$R_{18}$=1K
$R_{20}$=1K
$R_{19}$=1K
$R_{23}$=1K
$R_{21}$=50Ω
$C_{101}$=.005 μf.
$E_{16}$=1.5 volts
$L_{100}\cong 1\mu h.$ The transistors can be of type 2N2784.

It is to be understood that the forms of the invention shown and described herein are but preferred embodiments thereof and that various changes may be made in circuit design and in circuit component values without departing from the spirit or scope of the invention.

I claim:

1. A frequency divider for dividing the frequency of an input signal and comprising:

first and second electron valves each having an electron emitting electrode, an electron collecting electrode, and an electron control electrode;

battery source means;

impedance means connecting said battery source means across the electron collecting electrode-electron emitting electrode circuits of said first and second electron valves;

cross coupling circuits connecting the electron collecting electrodes of said first and second electron valves to the electron control electrodes of the second and first electron valves, respectively;

tapped inductive means connecting together the electron control electrodes of said first and second electron valves;

means for supplying said input signal to the tap of said inductive means; and means for extracting an output signal having a fundamental frequency one-half that of said input signal across a portion of said impedance means.

2. A frequency divider in accordance with claim 1 in which:

said battery source means comprises first and second terminals; and said impedance means comprises first and second resistive impedance means individually connecting the electron collecting electrodes of said first and second electron valves to a first terminal of said battery source means.

3. A frequency divider in accordance with claim 2 in which said cross coupling circuits comprise third and fourth resistive means.

4. A frequency divider in accordance with claim 2 in which said impedance means further comprises third resistive impedance means connecting said first and second electron emitting means to the second terminal of said battery source means.

5. A frequency divider in accordance with claim 4 in which said cross coupling circuits comprise fourth and fifth resistive means.

6. A frequency divider means in accordance with claim 5 in which said means for supplying said input signal to the tap of said inductive means comprises capacitive impedance means.

7. A frequency divider in accordance with claim 1 in which said impedance means further comprises third resistive impedance means connecting said first and second electron emitting means to the second terminal of said battery source means.

8. A frequency divider in accordance with claim 7 in which said cross coupling circuits comprise fourth and fifth resistive means.

9. A frequency divider means in accordance with claim 8 in which said means for supplying said input signal to the tap of said inductive means comprises capacitive impedance means.

10. A frequency divider in accordance with claim 1 in which said cross coupling circuits comprise second and third resistive means.

11. A frequency divider means in accordance with claim 10 in which said means for supplying said input signal to the tap of said inductive means comprises capacitive impedance means.

References Cited

UNITED STATES PATENTS

| | | | |
|---|---|---|---|
| 3,172,058 | 3/1965 | Freeborn | 331—113 |
| 3,292,106 | 12/1966 | Baldwin | 312—16 X |
| 3,334,292 | 8/1967 | King et al. | 321—45 |

LEE T. HIX, *Primary Examiner.*

G. GOLDBERG, *Assistant Examiner.*

UNITED STATES PATENT OFFICE
CERTIFICATE OF CORRECTION

Patent No. 3,399,311 August 27, 1968

John J. Andrea

It is certified that error appears in the above identified patent and that said Letters Patent are hereby corrected as shown below:

Column 1, line 31, "are" should read -- art --. Column 4, line 49, "and" should read -- through --; line 74, "eectrode' should read -- electrode --.

Signed and sealed this 20th day of January 1970.

(SEAL)
Attest:

Edward M. Fletcher, Jr.
Attesting Officer

WILLIAM E. SCHUYLER, JR.
Commissioner of Patents